United States Patent [19]
Hanson et al.

[11] Patent Number: 6,081,569
[45] Date of Patent: Jun. 27, 2000

[54] METHOD AND APPARATUS FOR DETERMINING THE CHANGE IN FREQUENCY OF A REFERENCE SIGNAL

[75] Inventors: Gary D. Hanson; Ioan V. Teodorescu, both of Plano, Tex.

[73] Assignee: Alcatel USA Sourcing, L.P., Plano, Tex.

[21] Appl. No.: 08/613,434

[22] Filed: Feb. 29, 1996

[51] Int. Cl.[7] .................................................. H04L 7/04
[52] U.S. Cl. .......................... 375/362; 375/355; 375/371; 377/39; 327/7
[58] Field of Search ................................. 327/39, 47, 48, 327/7; 375/226, 355, 360, 368, 371, 373, 362; 331/25, 1 A, 17, 16, 27, 11, 18

[56] References Cited

U.S. PATENT DOCUMENTS

| | | | |
|---|---|---|---|
| 3,849,733 | 11/1974 | Lawrence | 328/155 |
| 4,639,680 | 1/1987 | Nelson | 327/7 |
| 5,416,443 | 5/1995 | Cranford, Jr. et al. | 331/2 |
| 5,436,890 | 7/1995 | Read et al. | 370/58.2 |
| 5,500,627 | 3/1996 | Stein et al. | 340/147 |
| 5,657,361 | 8/1997 | Inagaki et al. | 377/39 |

FOREIGN PATENT DOCUMENTS 0343083A   11/1989   European Pat. Off. ......... H04L 7/04

OTHER PUBLICATIONS

"High–Speed Programmable Frequency Checker," IBM Technical Disclosure Bulletin, vol. 33, No. 3B, Aug. 1, 1990.

*Primary Examiner*—Stephen Chin
*Assistant Examiner*—Shuwang Liu
*Attorney, Agent, or Firm*—Baker Botts L.L.P.

[57] ABSTRACT

A method for determining the change in frequency of a clock signal (168). The method includes the step of counting the number of clock signal cycles (168) that occur over at least two time windows (162, 164). The number of clock signal cycles counted in the first time window (162) is compared to the number of clock signal cycles counted in the second time window (164).

8 Claims, 4 Drawing Sheets

METHOD AND APPARATUS FOR DETERMINING THE CHANGE IN FREQUENCY OF A REFERENCE SIGNAL

TECHNICAL FIELD OF THE INVENTION

This invention is related in general to timing signals. More particularly, the invention is related to a method and apparatus for determining the change in frequency of a timing signal.

BACKGROUND OF THE INVENTION

Many applications require synchronization of distributed discrete components with a central timing reference. For example, a telecommunications switching system may include a large number of discrete components that are used to perform the switching operations and other telecommunications services. Synchronization of components is of particular importance in digital communications, where a difference in timing of less than a microsecond can disrupt effective data transfer.

A digital cross-connect (DCC) system is a specialized switching system that provides improved flexibility in switching services. An example of a modern DCC system is provided by U.S. Pat. No. 5,436,890 to Read et al., entitled "Integrated Multirate Cross-Connect System," assigned to DSC Communications Corporation, issued Jul. 25, 1995 (hereinafter "Read"). Such DCC systems may include a plurality of devices that define the M input ports and N output ports, an M×N connection matrix switch operable to connect any of the M input ports to any of the N output ports, and an administration subsystem that provides synchronization, monitoring, and control for remapping of the connection matrix. In addition, the DCC system taught in Read contains redundant parallel planes (i.e., circuit paths) of all components, such that the DCC system can experience a number of failures without adversely affecting network traffic.

The potentially large number of components in a DCC system with redundant parallel planes complicates the control of DCCs and the communication of data between components of the DCC system. Such systems utilize a timing signal of high accuracy in order to ensure that data communications are not disrupted by variations in timing frequency. Nevertheless, signal drift may be introduced into the transmitted timing signals by component failure within phase-locked loops in the distributed components. In a DCC system with parallel planes, such signal drift can be particularly problematic as it is necessary to align the clock signals in each plane prior to performing any diagnostic analysis of equipment performance.

Although it is possible to determine signal drift of a high accuracy timing signal by comparing it to a local timing signal with high accuracy, such high accuracy timing signals require expensive circuitry to implement. If a low accuracy timing signal is used, it would not be possible to determine whether any differences in the measured timing signal were due to signal drift of the high accuracy signal or the inherent inaccuracy of the low accuracy signal.

A similar problem may be encountered with any other system that utilizes a large number of discrete components that receive asynchronous data or control commands from a centralized location. For example, air traffic control systems, cellular telecommunications systems, and distributed controls systems may experience service delays or failure because of data transmission delays.

SUMMARY OF THE INVENTION

Therefore, a need has arisen for a method and apparatus for determining the change in frequency of a reference signal that does not require a local oscillator with high accuracy.

Accordingly, one aspect of the present invention is a method for determining the change in frequency of a clock signal. The method includes the step of counting the number of clock signal cycles that occur over at least two time windows. The number of clock signal cycles counted in the first time window is compared to the number of clock signal cycles counted in the second time window.

Another aspect of the present invention is a system for determining the change in frequency of at least two clock signals. The system includes a detector that counts the number of clock signal oscillations that occur during at least two time windows for each clock signal. The system also includes a comparator that determines the mathematical difference between the number of oscillations counted during two of the time windows for each clock signal.

Yet another aspect of the present invention is a method for detecting drift in at least one reference clock signal in a communications system having at least two parallel planes. The method includes the step of counting the number of cycles of at least one reference clock signal from each plane that occur over at least two time windows. At least two of the numbers of cycles measured are then compared. If the measured number of cycles are not equivalent within a known accuracy, a clock drift signal is generated.

One important technical advantage of the present invention is the ability to determine if signal drift is occurring in a timing signal generated by a remote high accuracy oscillator using the timing signal generated by a local low accuracy oscillator. Such low accuracy oscillators are typically present in most distributed data communications equipment, which allows the present invention to be implemented without installation of additional hardware. Even in the absence of a low accuracy oscillator, such hardware may be economically added.

Another important technical advantage of the present invention is the ability to detect the failed system components that are causing a reference timing signal to drift. In the absence of a system and method for determining the change in frequency of a reference timing signal, such component failure can cause system failure until the failed component is isolated by testing each individual component.

BRIEF DESCRIPTION OF THE DRAWINGS

For a more complete understanding of the present invention and advantages thereof, reference is now made to the following description taken in conjunction with the accompanying drawings, wherein like reference numerals represent like parts, in which.

DETAILED DESCRIPTION OF THE INVENTION

In order to better describe the present invention, the invention will be applied to timing requirements for a DCC system. It is understood that the invention may also be applied in a variety of other applications that require high accuracy clocks.

Figure 1:
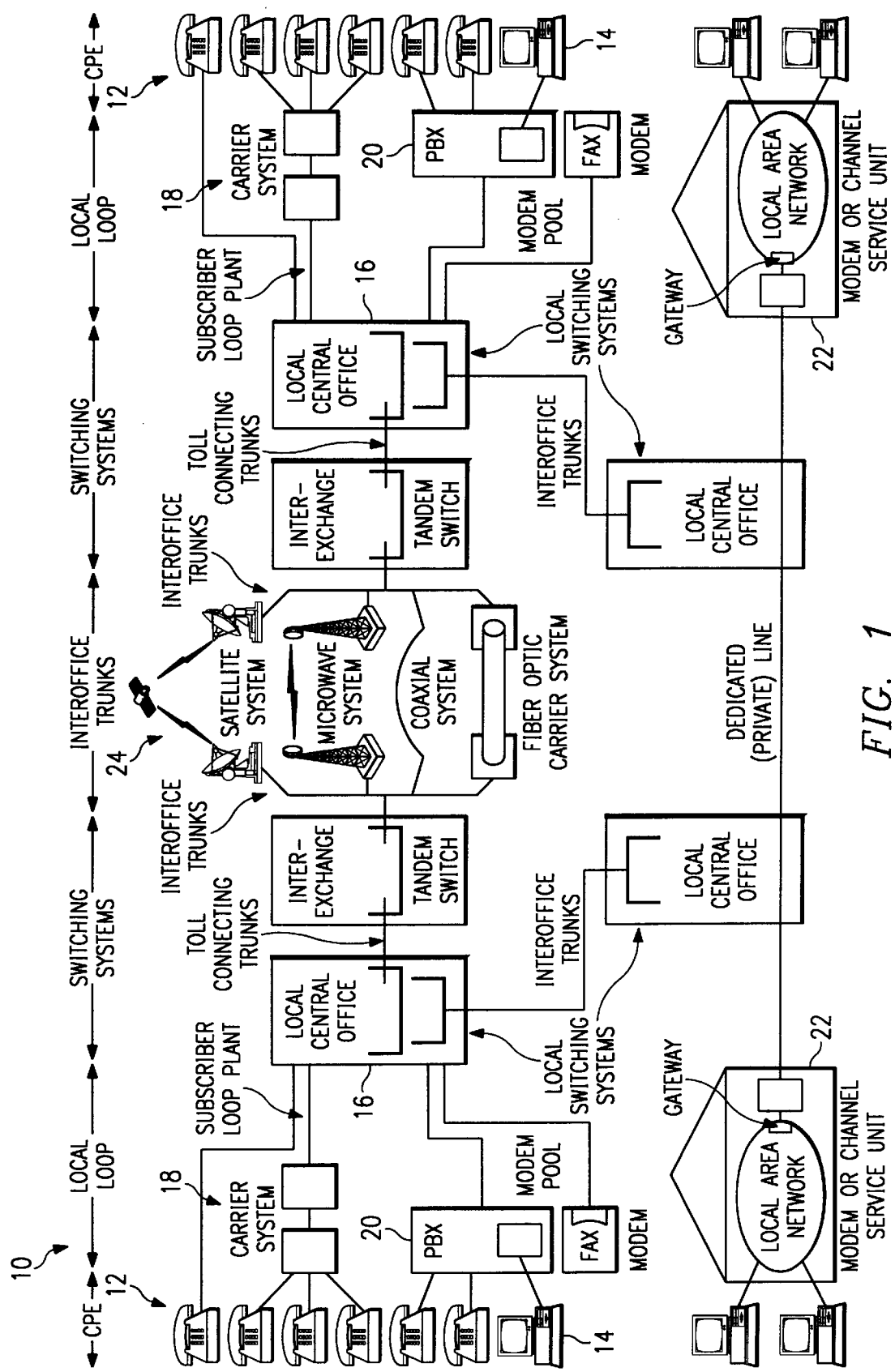
FIG. 1 shows an example of a modern telecommunications network.

FIG. 1 shows an example of modern telecommunications network 10. A plurality of telephones 12 or digital data stream sources 14 are connected to local central office 16 through carrier system 18, private branch exchange 20, local area network 22, or other distributed communications data sources. Local central office 16 is functional to connect subscribers from local central office 16 to other subscribers through interoffice trunks 24. Interoffice trunks 24 may include but not be limited to, fixed wireless local loop ("FWLL") systems, satellite systems, microwave systems, coaxial systems, and fiber optic carrier systems. A DCC system is typically used at local central office 16, but may also be used at carrier system 18, private branch exchange 20, or other locations that are not explicitly shown in FIG. 1. Timing signals may be used pervasively both within and between individual components of modern telecommunications network 10.

Figure 2:
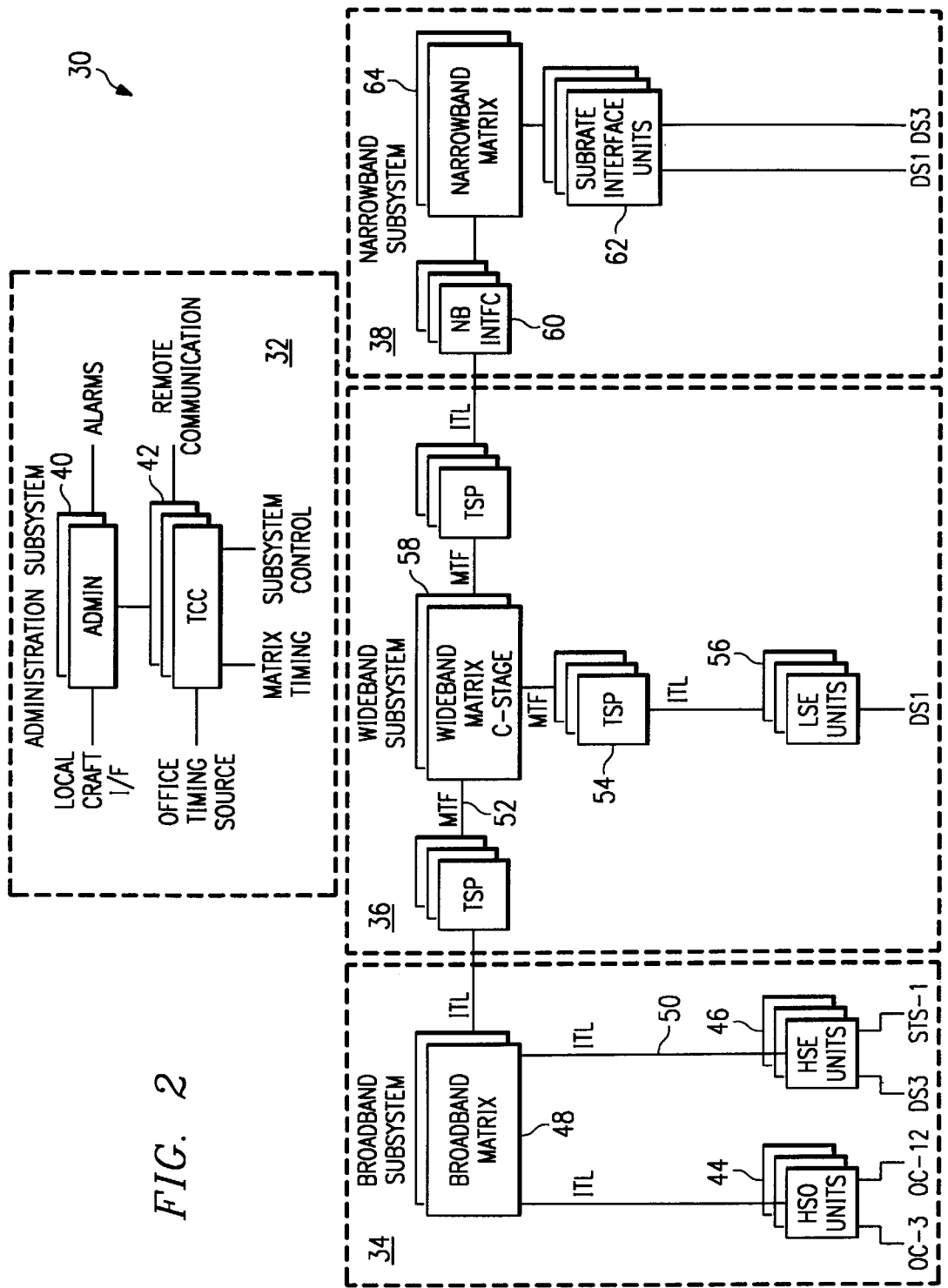
FIG. 2 shows an exemplary high level system architecture for a digital cross-connect system.

FIG. 2 presents a high level system architecture of a DCC system 30. DCC system 30 preferably provides an integrated platform for cross-connecting signals at broadband, wideband, and/or narrow band levels and supports cross-connection of both domestic and international rates and formats. DCC system 30 terminates synchronous optical, synchronous electrical, and asynchronous electrical network signals. Cross-connection is provided via a multi-rate, multi-subsystem architecture that insures maximum flexibility at all network levels. Such flexibility relies inherently on accurate timing for simultaneous control of distributed components. With multiple subsystems under a single administration control, DCC system 30 manages individual high capacity, non-blocking matrix subsystems in order to perform cross-connections. DCC system 30 includes an administration subsystem 32 and matrix subsystems including a broadband subsystem 34, a wideband subsystem 36 and a narrowband subsystem 38.

Administration subsystem 32 includes an administration unit 40 and a timing/communication controller (TCC) unit 42. Administration unit 40 performs operations, administration, maintenance, and provisioning (OAM&P) functions for DCC system 30. Administration unit 40 also provides communications interfaces to users and with central office discrete signals. Administration unit 40 handles system control for DCC system 30 through a hierarchical distribution scheme among the various components of the system, as described below.

Timing/communications controller (TCC) unit 42 provides communications and timing functions for DCC system 30. TCC 42 contains high accuracy oscillators, such as the Stratum 3, that are used to synchronize the operation of DCC system 30. TCC unit 42 may also receive an office timing source to generate the internal timing for synchronizing broadband subsystem 34, wideband subsystem 36, and narrowband subsystem 38. TCC unit 42 further controls each component within DCC system 30 through an hierarchy of controllers as supervised by administration unit 40. Timing synchronization may also be derived from network signals for distribution to each subsystem. Synchronization and control information from administration unit 40 are distributed throughout DCC system 30 by TCC unit 42.

Broadband subsystem 34 includes high speed optical (HSO) units 44 and high speed electrical (HSE) units 46 that are coupled to a broadband matrix unit 48. HSO units 44 and HSE units 46 are data transceivers. Internal transmission link 50 carries optical signals and permits flexibility in physical arrangement and location of DCC system 30 components. High accuracy timing signals from TCC 42 are transmitted to each HSO unit 44 and HSE unit 46, which use the transmitted timing signal to synchronize operations with other components of DCC 30.

Wideband subsystem 36 signals are cross-connected into internal synchronous channels 52 having a wideband matrix transport format (MTF). Higher rate network signals will normally access wideband subsystem 36 for tributary access or switching through broadband subsystem 34 over ITLs 50 and tributary signal processing (TSP) unit 54. TSP units 54 are data transceivers.

Wideband subsystem 36 includes low speed electrical (LSE) units 56, TSP units 54, and wideband matrix center stage 58. LSE units 56 are data transceivers. Network signals are cross-connected through wideband subsystem 36 in an internal MTF. High accuracy timing signals from TCC 42 are transmitted to each LSE unit 56, TSP unit 54, and to wideband matrix center stage 58, which use the transmitted timing signal to synchronize operations with other components of DCC 30.

Narrowband subsystem 38 includes narrowband interface unit 60, subrate interface units 62, and narrowband matrix unit 64. Narrowband interface units 60 and subrate interface units 62 are data transceivers. Narrowband subsystem 38 normally accesses network traffic through wideband subsystem 36. High accuracy timing signals from TCC 42 are transmitted to narrowband interface unit 60, subrate interface units 62, and narrowband matrix unit 64, which use the transmitted timing signal to synchronize operations with other components of DCC 30.

DCC system 30 may use redundant data paths in coupling each component together to increase operational reliability. Each subsystem may be organized in dual independent planes with no cross-coupling within the planes. In this configuration, each HSO unit 44, HSE unit 46, LSE unit 56, TSP unit 54, and other data transceiver within each subsystem has access to both planes and is capable of independently selecting an active plane. Thus, a number of failures can be accommodated in both planes without loss of network traffic. In this configuration, each redundant plane includes a redundant timing signal derived from the high accuracy oscillators in TCC 42.

Before any distributed control component can independently select an active plane, it must first synchronize or phase align the timing signals for the redundant planes. These timing signals require synchronization because the transmission path for the timing signal is different in each redundant plane. If signal drift is introduced in a timing signal, such as may occur when a component in a timing signal transmitter phase-locked loop fails, synchronization of the redundant timing signals cannot occur, unless the distributed control component can independently determine which timing signal is drifting.

Figure 3:
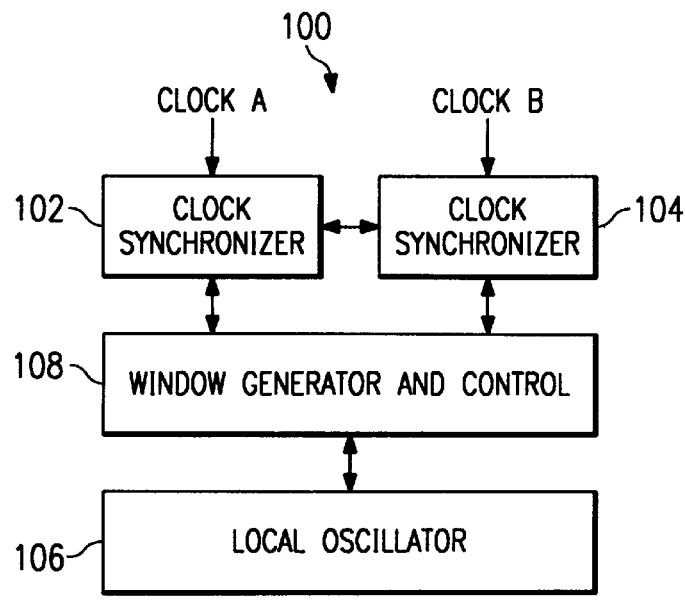
FIG. 3 is a diagram of a system for determining the change in frequency of a reference signal embodying concepts of the present invention.

FIG. 3 is a diagram of a system 100 for determining the change in frequency of a reference signal embodying concepts of the present invention. System 100 is contained within any distributed control component of DCC 30, such as HSO units 44, HSE units 46, TSP units 54, LSE units 56, narrowband interface unit 60, subrate interface units 62, broadband matrix 48, wideband matrix center stage 58, narrowband matrix 64, and other components. System 100 includes clock synchronizers 102 and 104, which are coupled to each other and by ITLs 50 (not explicitly shown) to TCC 42. Clock synchronizers 102 and 104 receive the clock timing signals for plane A and B, respectively, and phase shift the signals so that they are synchronous.

Clock synchronizers 102 and 104 are also coupled to window generator and control (WGC) unit 108. WGC unit 108 is coupled to local oscillator 106. In most applications, local oscillator 106 will be the oscillator that is already installed within the relevant distributed control component of DCC 30. Likewise, WGC unit 108 will be resident firmware within the processor that is already installed within the relevant distributed control component. The accuracy of local oscillator 106 need not be any greater than that required for use in distributed control components.

The basic principle of operation of system 100 is that a drift in the frequency of a clock signal can be determined by comparing the number of clock cycles in two time windows of equal size. For example, consider a clock with a nominal 6,480,000 Hz frequency. If the clock signal is sampled asynchronously over a time window, there may be a +/−1 cycle difference between the actual number of cycles that occurred during the time window and the number measured. When the frequency is drifting, the number of cycles measured during two different time windows will change, allowing the frequency shift to be detected. The +/−1 uncertainty complicates this analysis.

For example, consider an asynchronous measurement of a 6,480,000 Hz clock signal over a 1 second window. The measurement may range from 6,479,999 Hz to 6,480,001 Hz. If the frequency then drifts to 6,480,002 Hz, the measurement may range from 6,480,001 Hz to 6,480,003 Hz. Thus, even though the frequency has drifted by 2 Hz, it is possible that the same frequency might be measured. By extension, the frequency may drift from 6,480,000 Hz to 6,480,004 Hz, yet still yield results that could be mistaken for a frequency of 6,480,002 Hz. Therefore, a change of at least 5 Hz is required to result in an accurate measurement of clock frequency drift for every possible measurement, i.e. one that yields a change of at least 2 Hz in every measurement. This analysis assumes that any variations in the 1 second window are negligible.

This analysis leads to the following maximum possible accuracies for a given window for asynchronous measurement of a 6,480,000 Hz signal:

| Window Size ms | Nominal cycles | Required change | Sensitivity (PPM) |
|---|---|---|---|
| 10 | 64,800 | 5 | 77.2 |
| 20 | 129,600 | 5 | 38.6 |
| 30 | 194,400 | 5 | 25.7 |
| 40 | 259,200 | 5 | 19.3 |
| 50 | 324,000 | 5 | 15.4 |
| 60 | 388,800 | 5 | 12.9 |
| 70 | 453,600 | 5 | 11.0 |
| 80 | 518,400 | 5 | 9.7 |
| 90 | 583,200 | 5 | 8.6 |
| 100 | 648,000 | 5 | 7.7 |

To prevent inadvertent determination of signal drift, the required change may be increased to a greater number of cycles, with a corresponding loss in the sensitivity. This change may be useful where the lowest drift frequency is greater than the required change. For example, if the lowest drift frequency of the 6,480,000 Hz signal were 5,000 Hz, a sensitivity of greater than (5000/6,480,000) or 771 PPM would be sufficient to detect drift (e.g. a sensitivity of 700 PPM would be greater than a sensitivity of 771 PPM).

The present invention preferably provides for three clock signals in order to accurately determine which clock signal is drifting because this is a relative measurement procedure. If only two clock signals are used, it is not possible to determine which one is drifting, absent reference to some form of standard. The three clock signals can either be two high and one low accuracy clock signal in the first case, or one high and two low accuracy clock signals in the second case. In the first case, signal drift is assumed to be occurring in the low accuracy clock signal if drift is measured in both high accuracy clock signals. This assumption is based on the low probability that both high accuracy clock signals would be drifting, particularly if they are drifting by the same amount. In the second case, signal drift is assumed to be occurring in the high frequency signal only if it is so measured in reference to both low accuracy signals.

It is also important to note that the present invention is useful for measuring drift while it is occurring. Once drift has stopped, the difference in measured cycles between two time windows will return to zero. Nevertheless, the present invention could be used to measure an absolute difference in frequency between two high accuracy clock signals within a certain accuracy, by comparing the number of cycles counted in a first time window for a first high accuracy clock with the number of cycles counted in a second time window for a second high accuracy clock.

In operation, the quality of the reference clocks for plane A and plane B is preferably previously established, such as by phase alignment at system start-up. The present invention may then be used to monitor the quality of the reference clocks over time, to determine which clock is drifting when drift occurs. WGC unit 108 receives a local timing signal from local oscillator 106. WGC unit 108 then counts the number of cycles of a clock signal, for example, the clock signal for Plane A received by clock synchronizers 102 and 104 over ITLs 50. WGC unit 108 counts the clock signal cycles ("counts up") of the Plane A clock signal for a predetermined time period or "window". This window is equal to a predetermined number of cycles x of local oscillator 106.

At the end of the window, WGC unit 108 has counted up to a number Y that equals the sum of the number of cycles of the Plane A clock signal that occurred over X cycles of local oscillator 106. Because local oscillator 106 is of a lower accuracy and typically operates at a different frequency than that of the oscillator in TCC 42 that generates the Plane A clock signal, the number X will not typically equal the number Y. In addition, the two oscillators are operating asynchronously, so the accuracy of Y is +/−1 cycle because of phase differences between local oscillator 106 and the oscillator in TCC 42.

In the embodiment shown in FIG. 3, WGC unit 108 then subtracts clock signal cycles from the number Y ("counts down") over the next window, until a number Z is reached at the end of the second time period. The number Z is likewise subject to a +/−1 cycle accuracy. Thus, at the end of two windows, WGC unit 108 has counted up the number of Plane A clock signal oscillations to a number Y, and then counted down the number of Plane A clock signal oscillations to a number Z. If the number of oscillations counted up equals the number of oscillations counted down, then the absolute value of Z should be ≦2. The absolute value of Z is always an integer, and may be ≦2 because local oscillator 106 and the Plane A clock signal operate asynchronously. As previously noted, asynchronous operation means that the time window defined by local oscillator 106 may begin at a point prior to the beginning of the first cycle of the oscillator in TCC 42. Thus, one cycle may be lost or gained due to this asynchronous operation. If the number Z has an absolute value greater than 2, then the Plane A clock signal is undergoing drift.

In this manner, system 100 can detect when a measured clock signal is drifting, even when the accuracy of local oscillator 106 is lower than that of the measured clock signal. The underlying assumption of system 100 is that local oscillator 106 does not vary significantly over two consecutive time periods. For example, laboratory tests performed on oscillators typically used in applications such as local oscillator 106 confirmed that the maximum frequency change over any 1 second interval is 1 Hz or less. Therefore, when the duration of the window is significantly less than 1 second, inaccuracies in the relative frequency measurement from one window to the next window caused by local oscillator 106 inaccuracy is negligible.

As previously noted, it would be possible to implement the present invention using a single high accuracy clock with two local clocks having a lower accuracy, such as by using a local clock in blocks 102 and 104 and a high accuracy clock in block 106 of FIG. 3. In this alternate embodiment, a drifting high accuracy clock would yield the same results for either of the local clocks. If oscillator drift is indicated only by a first local clock and not the second, this indication would establish that the first local clock is drifting. Likewise, in the embodiment shown in FIG. 3, an indication that both Clock A and Clock B are drifting would be interpreted to mean that local oscillator 106 was in fact drifting, because of the low probability that both high accuracy signals are drifting.

One skilled in the art will recognize that other methods may be used besides counting up and counting down to compare the number of measured clock signal oscillations occurring over two consecutive windows without departing from the scope or the spirit of the present invention. For example, the number of high accuracy clock cycles may be counted for two consecutive low accuracy clock windows and compared. Likewise, one skilled in the art will recognize that any number of windows may be used to detect drift in the measured clock signal, and that these windows need not occur consecutively if the variation of the local oscillator between the time the two windows occur can be shown to be insignificant.

Figure 4:
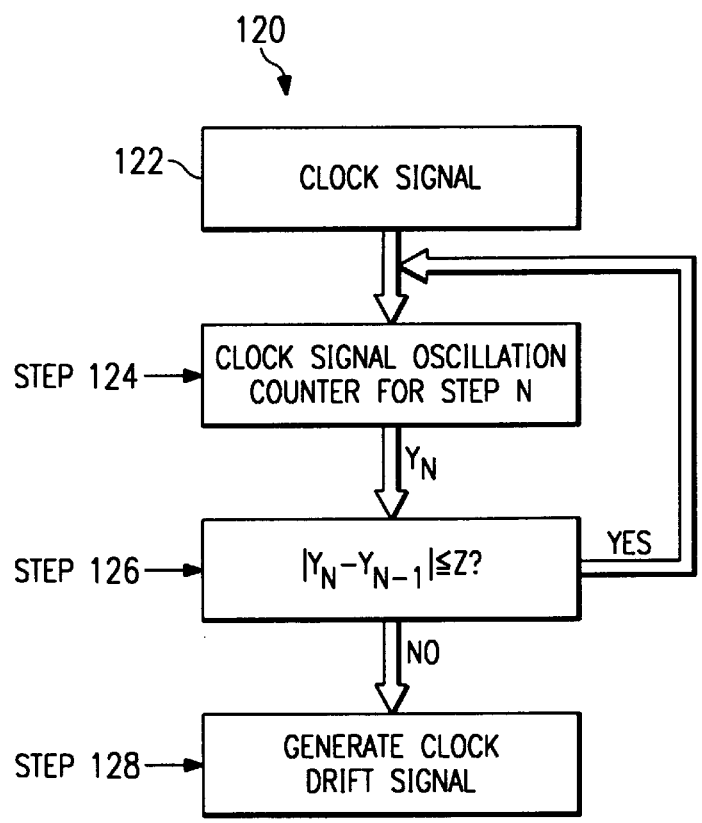
FIG. 4 is a block diagram of a method for determining the change in frequency of a reference signal in accordance with teachings of the present invention.

FIG. 4 is a block diagram of a method 120 for determining the change in frequency of a reference signal in accordance with teachings of the present invention. Clock signal 122 is received at step 124 by WGC unit 108, which then provides a number Y equal to the number of clock signal oscillations occurring over time window N. At step 126, the number Y for the present window N, $Y_N$, is compared to the number Y for the previous window N−1, $Y_{N-1}$. As noted previously, the previous window N−1 need not have occurred immediately prior to window N. If the absolute value of $Y_N$ minus $Y_{N-1}$ is greater than the tolerance Z, then method 120 proceeds to step 128 and a clock drift signal is generated. Otherwise, method 120 returns to step 124 for clock signal measurement over the next window.

Figure 5:
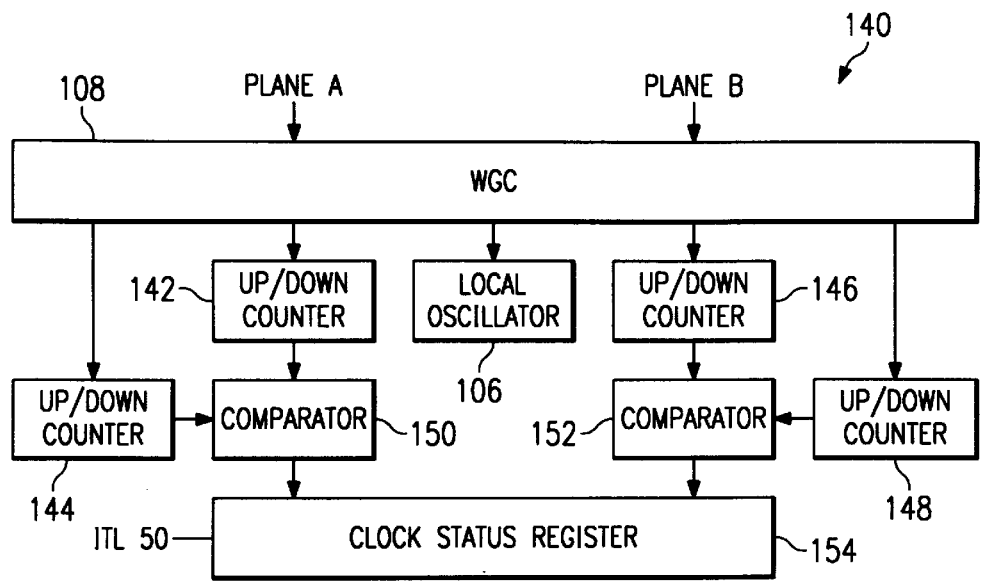
FIG. 5 is a block diagram of a frequency change detector for use in a distributed control component of a digital cross-connect system embodying concepts of the present invention.

FIG. 5 is a block diagram of a frequency change detector (FCD) 140 for use in a distributed control component of DCC 30 embodying concepts of the present invention. FCD 140 includes WGC unit 108, local oscillator 106, up/down counters (UDCs) 142, 144, 146, and 148, comparators 150 and 152, and clock status register 154. WGC unit 108 receives inputs from the Plane A and Plane B clock signals and the local oscillator, and outputs a count signal. The count signal sent to UDCs 142 and 144 corresponds to the Plane A clock signal, and the count signal sent to UDCs 146 and 148 corresponds to the Plane B clock signal. UDCs 142 and 144 are synchronized such that when UDC 142 is counting up, UDC 144 is counting down. Thus, UDCs 142 and 144 alternately output a final count Z to comparator 150 after each window.

Comparators 150 and 152 compare the output of the associated UDCs to determine whether the absolute value of the output of a UDC exceeds 2, which is indicative of drift in the associated Plane clock signal. If drift is detected in the Plane A or Plane B clock signal by comparators 150 and 152, respectively, a clock drift signal is sent to clock status register 154. Clock status register 154 buffers the clock drift status signal and sends notification of the drifting clock signal to TCC 42 over ITLs 50. Alignment of the data communications system between Plane A and Plane B can be changed so that it does not use the signal of a plane clock if the measured number of cycles are not equivalent within a predetermined tolerance.

Figure 6:
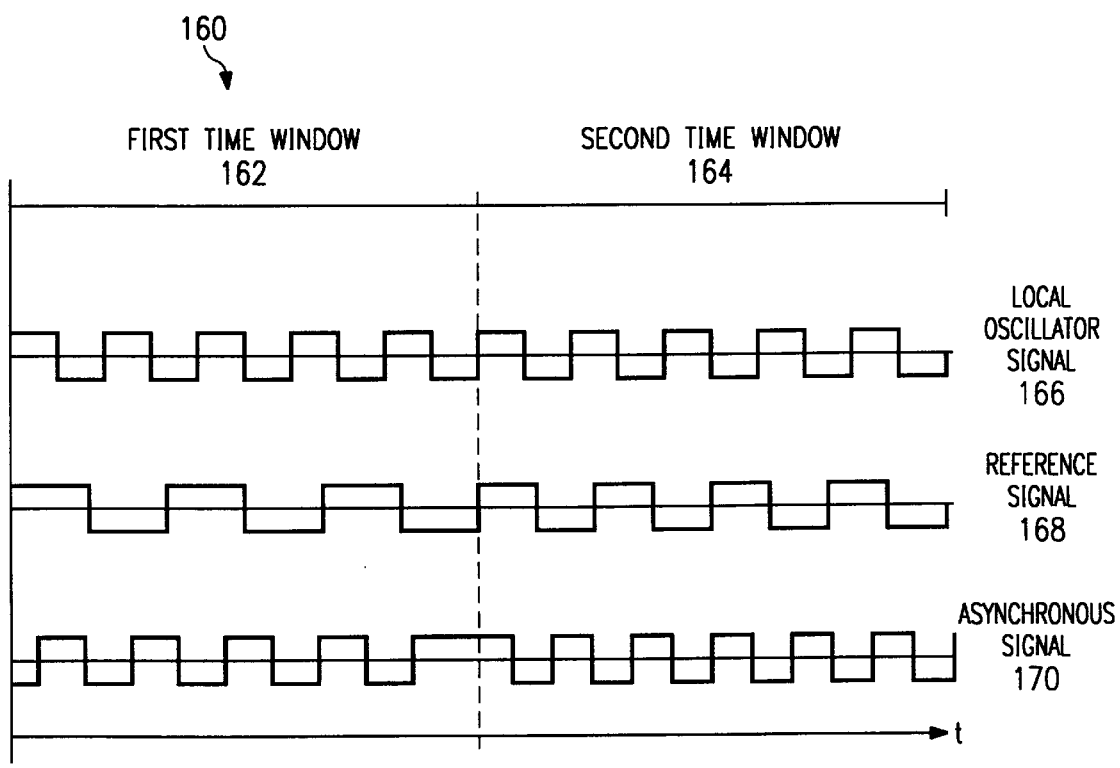
FIG. 6 is a timing diagram of a system for determining the change in frequency of a reference signal in accordance with teachings of the present invention.

FIG. 6 is an exemplary timing diagram 160 of a system for determining the change in frequency of a reference signal in accordance with teachings of the present invention. Timing diagram 160 includes first time window 162 and second time window 164. As shown in FIG. 6, the time duration of first time window 162 and second time window 164 is equal to the period of five cycles of local oscillator signal 166. Also shown in FIG. 6 is reference signal 168, which undergoes three cycles during first time window 162 and four cycles during second time window 164. Therefore, reference signal 168 is drifting in frequency.

By comparing the number of cycles of reference signal 168 that occur during first time window 162 with the number of cycles of reference signal 168 that occur during second time window 164, it is possible to detect such frequency shifts, even though the accuracy of local oscillator signal 166 is much less than the accuracy of reference signal 168. Reference signal 168 of the timing diagram of FIG. 6 is an example of a synchronous timing signal, i.e. one in which local oscillator 166 and reference signal 168 are in phase. In an application where the timing is asynchronous, such as asynchronous timing signal 170, a one cycle difference between two time windows would not be sufficient to allow a frequency shift to be detected. The number of cycles counted for asynchronous timing signal 170 would be five for both first time window 162 and second time window 164, even though the total number of cycles in first time window 162 is less than 5 and the total number of cycles in second time window 164 is greater than 5.

If the timing diagram of reference signal 168 of FIG. 6 were applied in an FCD 140 of FIG. 5, UDCs 142, 144, 146, and 148 would operate over first time window 162 and second time window 164 to count up to 3 and count down to −1. As previously noted, UDCs 142, 144, 146, and 148 of FIG. 5 are designed to operate on alternate planes and in overlapping pairs of time windows. One skilled in the art will recognize that the timing diagrams of FIG. 6 are exemplary in nature, and that many other timing schemes may be used to determine the change in frequency of a reference signal in accordance with the teachings of the present invention.

Thus, it is possible to determine when a frequency shift is occurring in a high accuracy reference clock signal by comparing the number of clock cycles in two time windows. These time windows may be determined by the number of cycles of a low accuracy local clock. The time windows need not be immediately consecutive as long as the variation in the number of cycles of the low accuracy local clock is not significant for the time period that encompasses the time windows.

Although the present invention and its advantages have been described in detail, it should be understood that various changes, substitutions and alterations can be made therein without departing from the spirit and scope of the invention as defined by the appended claims.

What is claimed is:

1. A method for detecting drift in at least one reference clock signal in a data communications system having at least two planes comprising the steps of:

measuring the number of cycles of at least one reference clock signal of each plane over at least a first and a second time window by:
counting up on the first of at least two counters over the first time window; and
counting down on the first of at least two counters over the second time window to yield a first measured number of cycles, wherein the first and second time windows are determined in response to an asynchronous clock signal, the reference clock signal not being synchronized to the asynchronous clock signal;

comparing at least two of the measured numbers of cycles; and outputting a clock drift signal if the measured number of cycles are not equivalent within a predetermined accuracy.

2. The method of claim 1 wherein the step of measuring further comprises the steps of:
counting up on the second of at least two counters over the second time window; and
counting down on the second of at least two counters over a third time window to yield a second measured number of cycles.

3. The method of claim 1 wherein the step of measuring comprises measuring the number of cycles of at least one reference clock signal over at least two consecutive time windows.

4. A method for detecting drift in at least one reference clock signal in a data communications system having at least two planes comprising the steps of:

measuring the number of cycles of at least one reference clock signal of each plane over at least two time windows by:
counting up on the first of at least two counters over a first time window; and
counting down on the first of at least two counters over a second time window that is consecutive to the first time window to yield a first measured number of cycles;

comparing at least two of the measured numbers of cycles; and outputting a clock drift signal if the measured number of cycles are not equivalent within a predetermined accuracy.

5. The method of claim 4 wherein the step of measuring further comprises the steps of;
counting up on the second of at least two counters over the second time window; and
counting down on the second of at least two counters over a third time window that is consecutive to the second time window to yield a second measured number of cycles.

6. The method of claim 5, further comprising steps of:

comparing the absolute value of the number in the first counter to the absolute value of the number in the second counter;

determining that there is no drift in frequency of the first clock signal and the second clock signal in response to the absolute value of the number in the first counter being equal to the absolute value of the number in the second counter.

7. The method of claim 6, further comprising a step of:

determining that there is drift in frequency of the local timing generator in response to the absolute value of the number in the first counter being greater than the predetermined accuracy.

8. A method for detecting drift in at least one reference clock signal in a data communications system having at least two planes comprising the steps of:

measuring the number of cycles of at least one reference clock signal of each plane over at least a first and a second time window by:
counting up on the first of at least two counters over the first time window; and
counting down on the first of at least two counters over the second time window to yield a first measured number of cycles, wherein the first and second time windows are determined in response to an asynchronous clock signal;

comparing at least two of the measured numbers of cycles; and outputting a clock drift signal if the measured number of cycles are not equivalent within a predetermined accuracy, wherein the second time window occurs subsequently to and non-consecutive with the first time window.

* * * * *